(12) United States Patent
Chan et al.

(10) Patent No.: US 6,716,693 B1
(45) Date of Patent: Apr. 6, 2004

(54) METHOD OF FORMING A SURFACE COATING LAYER WITHIN AN OPENING WITHIN A BODY BY ATOMIC LAYER DEPOSITION

(75) Inventors: Lap Chan, Singapore (SG); Sanford Chu, Singapore (SG); Chit Hwei Ng, Singapore (SG); Yelehanka Ramachandramurthy Pradeep, Singapore (SG); Jia Zhen Zheng, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 60 days.

(21) Appl. No.: 10/400,511

(22) Filed: Mar. 27, 2003

(51) Int. Cl.$^7$ .................. H01L 21/8234; H01L 21/8244
(52) U.S. Cl. ...................... 438/238; 438/381; 438/618; 438/622; 438/687
(58) Field of Search ................ 438/238, 381, 438/618–645, 667–681, 687

(56) References Cited

U.S. PATENT DOCUMENTS

| | | | |
|---|---|---|---|
| 6,187,647 B1 | 2/2001 | Chu | 438/381 |
| 6,225,221 B1 | 5/2001 | Ho et al. | 438/678 |
| 6,249,039 B1 | 6/2001 | Harvey et al. | 257/531 |
| 6,284,646 B1 | 9/2001 | Leem | 438/629 |
| 6,305,314 B1 | 10/2001 | Sneh et al. | 118/723 R |
| 6,387,747 B1 * | 5/2002 | Cha et al. | 438/238 |
| 6,399,997 B1 * | 6/2002 | Lin et al. | 257/531 |
| 6,444,517 B1 * | 9/2002 | Hsu et al. | 438/238 |
| 6,518,141 B2 * | 2/2003 | Lee et al. | 438/381 |
| 6,534,374 B2 * | 3/2003 | Johnson et al. | 438/381 |
| 6,548,365 B2 * | 4/2003 | Basteres et al. | 438/381 |
| 6,573,148 B1 * | 6/2003 | Bothra | 438/381 |

* cited by examiner

Primary Examiner—Thanh Nguyen
(74) Attorney, Agent, or Firm—George O. Saile; Rosemary L. S. Pike

(57) ABSTRACT

An improved new process for fabricating multilevel interconnected vertical channels and horizontal channels or tunnels. The method has broad applications in semiconductors, for copper interconnects and inductors, as well as, in the field of bio-sensors for mini- or micro-columns in gas or liquid separation, gas/liquid chromatography, and in capillary separation techniques. In addition, special techniques are described to deposit by atomic layer deposition, ALD, a copper barrier layer and seed layer for electroless copper plating, filling trench and channel or tunnel openings in a type of damascene process, to form copper interconnects and inductors.

28 Claims, 7 Drawing Sheets

METHOD OF FORMING A SURFACE COATING LAYER WITHIN AN OPENING WITHIN A BODY BY ATOMIC LAYER DEPOSITION

RELATED PATENT APPLICATIONS

This application is related to Ser. No. 10/439,923, filing date Aug. 16, 2003, assigned to a common assignee.

BACKGROUND OF THE INVENTION (1) Field of the Invention

This invention relates to a method of fabricating multilevel interconnected vertical channels and horizontal channels or tunnels, for applications in both integrated circuits and bio-sensors, forming copper interconnects and inductors by atomic layer deposition, ALD, of a copper barrier layer and copper seed layer, in the vertical channels and horizontal channels or tunnels.

(2) Description of Related Art

In this section a description of related Prior Art background patents follows.

U.S. Pat. No. 6,225,221 B1 entitled "Method to Deposit a Copper Seed Layer for Dual Damascene Interconnects" granted May 1, 2001 to Ho et al. describes a method of depositing a copper seed layer in the manufacture of an integrated circuit device. The copper seed layer is thin and conformal for subsequent electroless plating of copper. A dielectric layer is patterned to form vias and trenches for planned dual damascene interconnects. A barrier layer of tantalum, titanium, or tungsten is deposited overlying the dielectric layer to line the vias and trenches. A copper seed layer is deposited overlying the barrier layer by the reaction of $CuF_2$ vapor with the barrier layer.

U.S. Pat. No. 6,284,646 B1 entitled "Method of Forming Smooth Conductive Layers for Integrated Circuit Devices" granted Sep. 4, 2001 to Leem describes a method for forming a metal layer for an integrated circuit device includes forming a first conductive layer on an integrated circuit substrate. While forming the first conductive layer, a reflection index of the first conductive layer is monitored, and the formation of the first conductive layer is terminated when the reflection index of the first conductive layer reaches a predetermined value. The first conductive layer can be an aluminum layer having a thickness in the range of approximately 500 Angstroms to 1500 Angstroms.

U.S. Pat. No. 6,249,039 B1 entitled "Integrated Inductive Components and Method of Fabricating Such Components" granted Jun. 19, 2001 to Harvey et al. teaches a method of fabricating inductive components in which there is built up thin films in trenches. An inductive component includes a substrate on the surface of which is a lower insulation layer having a shallow concavity or trench, a first plurality of conductive elements formed in the trench, a magnetic core formed over the first plurality of conductive elements, and a second plurality of conductive elements formed over the core. The first and second pluralities of conductive elements are connected to each other so as to form an inductive coil around the core. First and second core insulation layers are disposed between the core and the first and second pluralities of conductive elements, respectively. The component is fabricated by a method in which it is built up in the trench using thin film techniques.

U.S. Pat. No. 6,187,647 B1 entitled "Method of Manufacturing Lateral High-Q Inductor for Semiconductor Devices" granted Feb. 13, 2001 to Chu teaches a method of forming an inductor for a semiconductor device comprises the steps of forming the bottom legs on a first substrate; depositing a second substrate layer over the first substrate; forming the pair of side legs for each loop through the second substrate layer; and, forming top legs connecting pairs of side legs extending from adjacent bottom legs. The step of providing the side legs includes forming a pair of vias through the second substrate layer to the bottom legs, and depositing side legs in the vias. The step of forming the top legs preferably includes forming a channel between the pairs of vias respectively communicating with the adjacent bottom legs, and depositing top legs in the channels. Additionally, the steps of forming the side and top legs are performed concurrently.

U.S. Pat. No. 6,305,314 B1 entitled "Apparatus and Concept for Minimizing Parasitic Chemical Vapor Deposition During Atomic Layer Deposition" granted Oct. 23, 2001 to Sneh et al. teaches a method and apparatus for avoiding contamination of films deposited in layered depositions, such as Atomic Layer Deposition (ALD) and other sequential chemical vapor deposition (CVD) processes. The CVD deposited contamination of ALD films is prevented by use of a pre-reaction chamber that effectively causes otherwise-contaminating gaseous constituents to deposit on wall elements of gas-delivery apparatus prior to entering the ALD chamber.

SUMMARY OF THE INVENTION

It is a general object of the present invention to provide an improved method of forming multilevel interconnected vertical channels and horizontal channels or tunnels. The method has broad applications in both integrated circuits and bio-sensors: in the field of semiconductors, for fabricating both copper interconnects and inductors, and in the field of bio-sensors, for applications in the formation of mini- or micro-columns for gas or liquid separation, and gas/liquid chromatography, and similar capillary separation techniques. Furthermore, for semiconductor integrated circuit applications, special techniques are described to deposit by atomic layer deposition, ALD, a copper barrier layer and seed layer, for subsequent electroless copper plating, filling trench and channel or tunnel openings, in a type of damascene process to form copper interconnects and inductors.

A process flow outlining the method of the present invention is as follows, for interconnects and inductors:

(1) Formation of trenches and channels by using a sacrificial silicon nitride layer
(2) Atomic layer deposition of a copper barrier layer and copper seed layer in the trenches and channel,
(3) Electroless deposition of copper upon seed layer,
(4) Chemical mechanical polishing back of excess copper,
(5) Barrier deposition, SiN, to seal the copper openings in forming copper interconnects and inductors.

Key to the method of the present invention, is the use of a sacrificial silicon nitride layer to form trenches and channels. Also, key is the deposition by atomic layer deposition of a copper barrier layer and copper seed layer, for subsequent electroless copper plating in a damascene type process, with trench and channel or tunnel openings. The end result is the fabrication of inlaid copper interconnects and inductors.

This invention has been summarized above and described with reference to the preferred embodiments. Some processing details have been omitted and are understood by those skilled in the art. More details of this invention are stated in the "DESCRIPTION OF THE PREFERRED EMBODIMENTS" section.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The present invention describes an improved method of forming multilevel interconnected vertical channels and horizontal channels or tunnels. The new and improved method has broad applications in both integrated circuits and bio-sensors: in the field of semiconductors, for fabricating both copper interconnects and inductors, and in the field of bio-sensors, for applications in the formation of mini- or micro-columns for gas or liquid separation, gas/liquid chromatography, and similar capillary separation techniques. Furthermore, for semiconductor integrated circuit applications, special techniques are described to deposit by atomic layer deposition, ALD, a copper barrier layer and seed layer, for subsequent electroless copper plating, filling trench and channel or tunnel openings, in a type of damascene process to form copper interconnects and inductors.

A process flow outlining the method of the present invention is as follows, for interconnects and inductors:

(1) Formation of trenches and channels by using a sacrificial silicon nitride layer
(2) Atomic layer deposition of a copper barrier layer and copper seed layer in the trenches and channel,
(3) Electroless deposition of copper upon seed layer,
(4) Chemical mechanical polishing back of excess copper,
(5) Barrier deposition, SiN, to seal the copper openings in forming copper interconnects and inductors.

Key to the method of the present invention, is the use of a sacrificial silicon nitride layer to form trenches and channels. Also, key is the deposition by atomic layer deposition of a copper barrier layer and copper seed layer, for subsequent electroless copper plating in a damascene type process, with trench and channel or tunnel openings. The end result is the fabrication of inlaid copper interconnects and inductors.

Figure 1A:
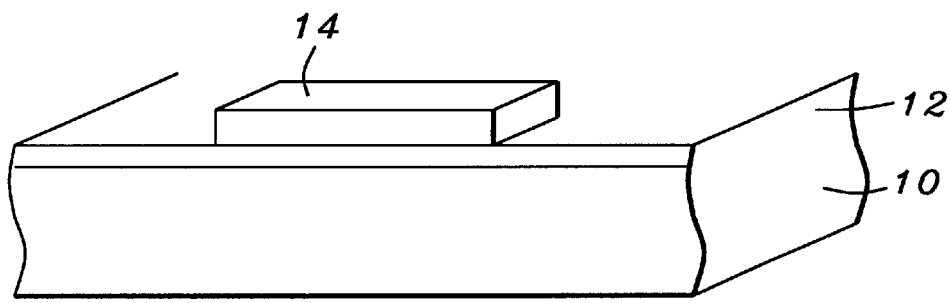
FIGS. 1A–1C, which in cross-sectional representation illustrate the first part of the method of the present invention, in which vertical vias and horizontal channels are being formed.
Figure 1B:
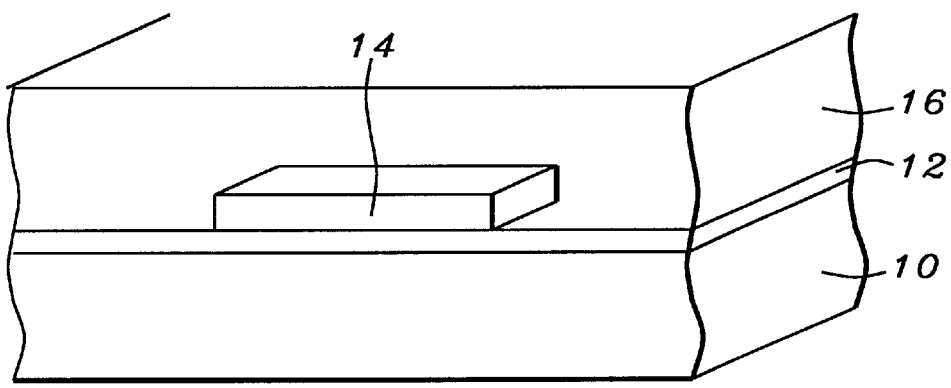
Figure 1C:
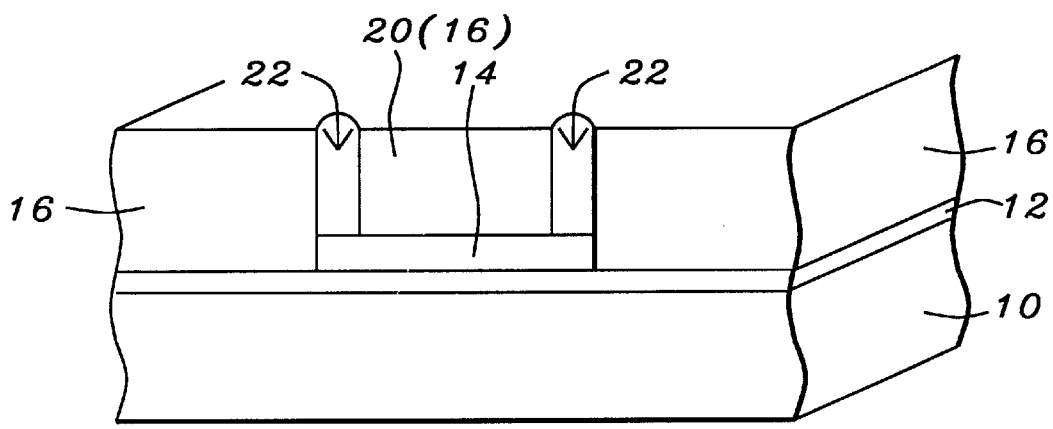

FIGS. 1A–1C, which in cross-sectional representation illustrate the first part of the method of the present invention, in which vertical trenches and horizontal channels are being formed.

Referring to FIG. 1A, which in cross-sectional representation illustrates the first part of the method of the present invention, namely, providing a silicon substrate 10 and the forming of an insulating layer, thin, 12 over the silicon substrate 10. The next process step is the forming of a patterned first silicon nitride sacrificial layer 14, for subsequent channel.formation, over the thin first insulating layer 12. More specifically, the semiconductor substrate 10 includes one or more layers of insulating material and/or conductive material and one or more active and/or passive devices, formed in or over the substrate, or the like, and one or more interconnect structures, such as, vias, contacts, trenches., metal wiring and the like. Next, an insulating layer, thin, 12, over the silicon substrate 10, is formed. Key to the present invention is the forming of a patterned first silicon nitride sacrificial layer 14, that is used in subsequent channel formation. The patterned first silicon nitride sacrificial layer 14, is formed over the thin first insulating layer 12.

Referring to FIG. 1B, which in cross-sectional representation illustrates the next part of the method of the present invention, namely, providing a first dielectric layer, thick, 16 overlying the patterned first silicon nitride sacrificial layer 14, by deposition. Then, planarizing the first dielectric layer, thick, 16 by chemical mechanical polishing, as shown in FIG. 1B, which depicts a smooth, flat planar surface for the first dielectric layer, thick, 16.

Referring to FIG. 1C, which in cross-sectional representation illustrates another key part of the method of the present invention, namely, forming via openings 22 (arrows) in the first dielectric layer, thick, 16, by patterning and selectively removing vertical regions of the first dielectric layer, thick, by a reactive ion etch, stopping on the silicon nitride sacrificial layer 14. This process isolates regions 20(16) of the first dielectric layer, thick, 16 and exposes portions of the underlying silicon nitride sacrificial layer 14.

Figure 2A:
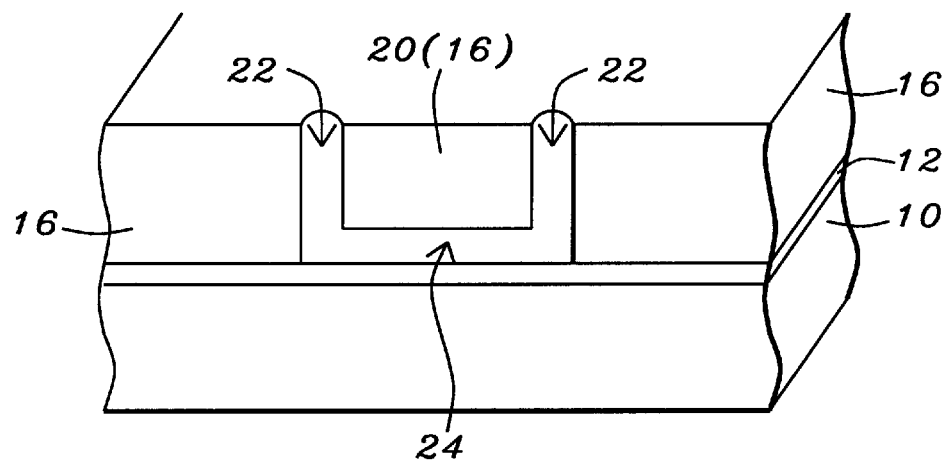
FIGS. 2A–2B, illustrate in part the method of the present invention, in which vertical trenches and horizontal channels are formed.
Figure 2B:
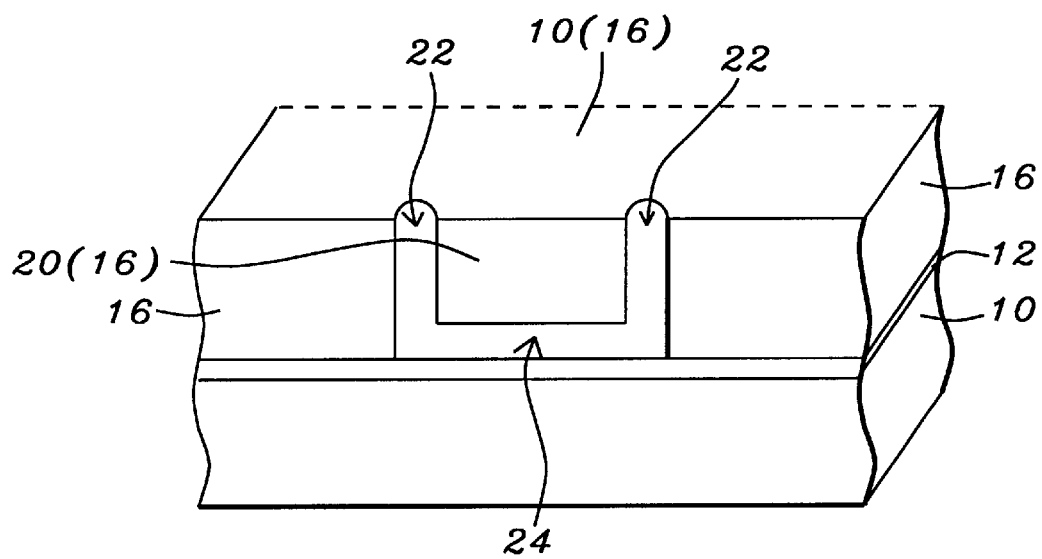

FIGS. 2A–2B, illustrate in part the method of the present invention, in which vertical trenches and horizontal channels are formed.

Referring to FIG. 2A, which in cross-sectional representation illustrates a key part of the method of the present invention, namely, the sacrificial layer of silicon nitride is now wet etched away forming horizontal channels 24 (arrow). Furthermore, by selectively wet etching away the underlying sacrificial silicon nitride layer, there is now formed both vertical channels 22 and horizontal channels 24 or tunnels in the first dielectric layer, thick, 16, as shown in FIG. 2B.

Referring to FIG. 2B, which in three dimensional representation illustrates the final part of forming vertical channels, and horizontal channels, and is the direct result of the prior processing steps. Notice, the isolation of a region of the first dielectric layer, thick, 20 (16), after the underlying sacrificial silicon nitride layer is removed. The isolation of a region of the first dielectric layer, thick, 20 (16), is shown "freestanding", but is anchored somewhere in the background, out of view of the sketched region. Note, the formation of both vertical channels 22 and horizontal channels 24 or tunnels in the first dielectric layer, thick, as shown in the three dimensional rendering, FIG. 2B.

Figure 3A:
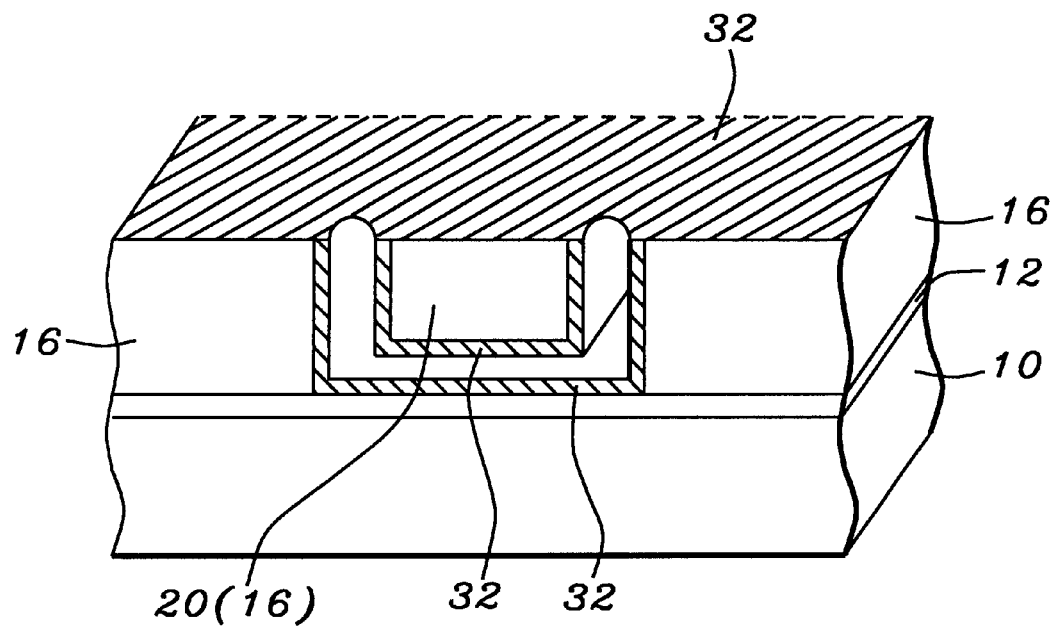
FIGS. 3A–3C, which in three-dimensional representation illustrate the atomic layer deposition of copper, that fills in the vertical trenches and horizontal channels, and excess copper is chemical mechanically polished back and planarized. Then, this is followed by using a standard single copper damascene process, and thus, forming the top channel region for the copper inductor.
Figure 3B:
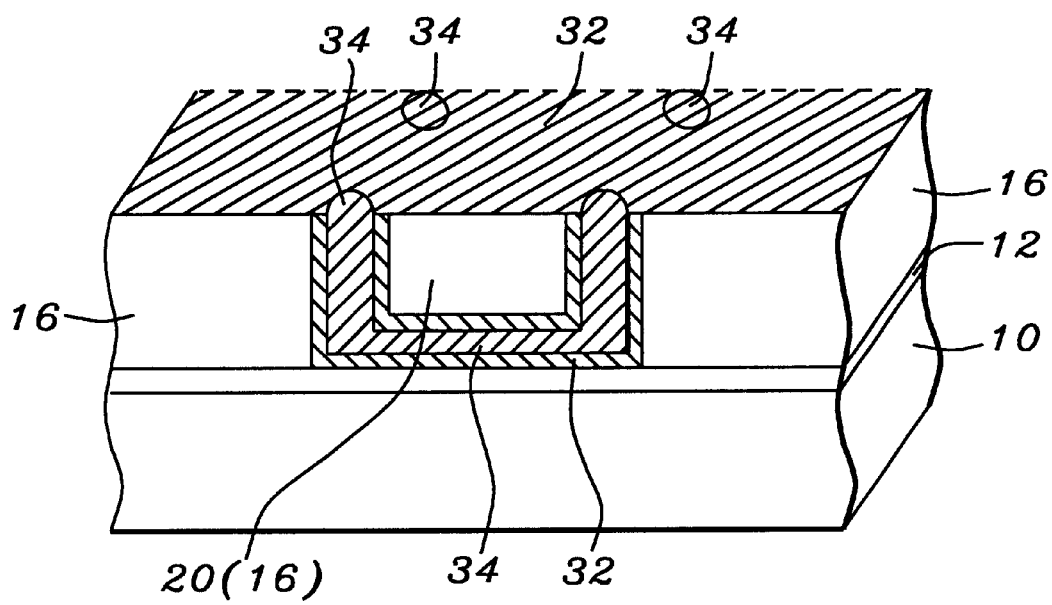
Figure 3C:
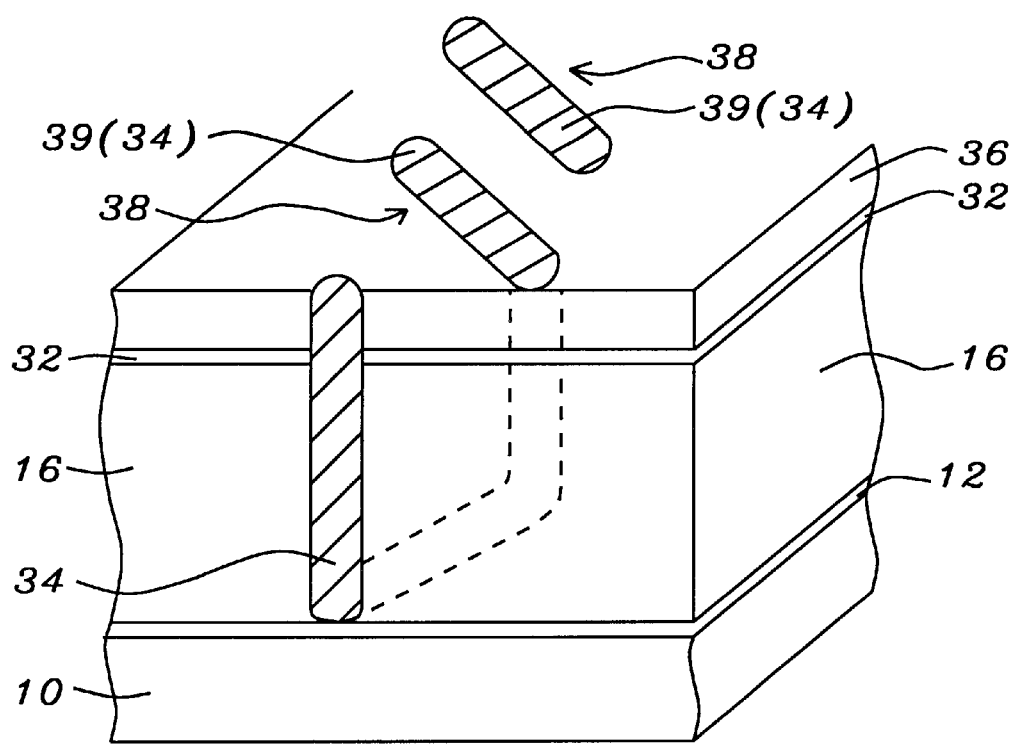

FIGS. 3A–3C, which in three-dimensional representation illustrate the atomic layer deposition of copper, that fills in the vertical trenches and horizontal channels, and excess copper is chemical mechanically polished back and planarized. Then, this is followed by using a standard single copper damascene process, and thus, forming the top channel region for the copper inductor.

Referring to FIG. 3A, which in three dimensional representation illustrates the forming of both a copper barrier layer and a copper seed layer in the vertical channels, and bottom horizontal channels. Firstly, a copper barrier layer 32 and copper seed layer 32 (too thin to sketch, both labeled layer #32), are deposited respectively by atomic layer deposition, ALD, over the exposed surfaces, as crudely sketched in the three dimensional rendering, FIG. 3A.

Referring to FIG. 3B, which in three dimensional representation illustrates the second set of steps in method of the present invention, the electroless deposition of copper 34, over the seed and the copper barrier layers 32, forming excess copper on the surface. The thick copper layer 34 dips into the trench, channel and tunnel openings. The plated thick copper deposition is approximately from 2,000 to 10,000 Angstroms in thickness.

Referring again to FIG. 3B, which in three dimensional representation illustrates the planarization of the excess material in the trench, channel and tunnel openings channels to form conducting interconnect wiring, with inlaid copper in a damascene process. Note, the excess material in the thick copper layer 34 is polished back and planarized, along with the barrier and copper seed layer 32, by chemical mechanical polish (CMP). This completes the process for forming copper interconnects and the vertical region of the inductor.

Referring to FIG. 3C, which in three dimensional representation illustrates the final steps in the method of the present invention. After the above step, a barrier layer (32) comprising a 500 Angstroms thick layer of SiN is deposited by PECVD, plasma-enhanced chemical vapor deposition. Next, a second IMD, 36 (16), interlevel metal dielectric layer from 4,000 to 6,000 Angstroms thick is deposited by PECVD, plasma-enhanced chemical vapor deposition. This second IMD layer 36, is similar to the first IMD layer 16. A top trench is patterned and etched forming a top channel 39 (arrow). This top channel 38 is then filled with copper barrier and copper 39, CMP chemical mechanical polished back, similar to 34. Polishing back the copper, forms the top region of the copper inductor 39. Again, this patterning and etching of the top region of IMD is performed forming the top region of the inductor 39, using a standard single damascene process. The above processing steps can be repeated to produce multi-level metal wiring and inductor layers.

A summary of the sequence of processing steps to produce interconnects and inductors is as follows:

(a) starting with an insulating layer, thin, overlying a substrate;

(b) forming a patterned first silicon nitride sacrificial layer, for subsequent channel formation, over the first insulating layer;

(c) providing a first dielectric layer, thick IMD, overlying the patterned first silicon nitride sacrificial layer;

(d) forming a patterned second silicon nitride sacrificial layer over the first dielectric layer, thick IMD;

(e) forming a second dielectric layer, thin IMD, over the patterned second silicon nitride and planarizing the second dielectric layer, thin IMD, by chemical mechanical polishing;

(f) forming via openings in the second dielectric layer, thin IMD, by patterning and selectively removing regions of the second dielectric layer, thin IMD, by a reactive ion etch, stopping on the second silicon nitride sacrificial layer, while exposing portions of the underlying first silicon nitride sacrificial layer;

(g) changing the plasma etching chemistry to etch through the exposed regions of the underlying second silicon nitride sacrificial layer, and while continuing to pattern the first dielectric layer, thick IMD, forming vertical regions of the inductor by reactive ion etching, stopping on the first silicon nitride sacrificial layer;

(h) selectively wet etching away the underlying first and second silicon nitride sacrificial layers, forming both top and bottom horizontal channel or tunnel openings;

(i) depositing a bottom copper barrier layer, first barrier, coating both vertical channels and horizontal channels or tunnels in the first and second dielectric layers, by atomic layer deposition;

(j) depositing a copper seed layer overlying the copper barrier layer, by atomic layer deposition, coating the surface of trench and channel or tunnel with a copper barrier layer and a copper seed layer;

(k) performing electroless copper plating copper on the copper seed layer filling trench and channel or tunnel openings with an excess of copper;

(l) removing the excess of copper and planarizing back the excess copper by chemical mechanical polishing;

(m) depositing a top blanket copper barrier layer, second barrier, thus completing the fabrication of inlaid copper interconnects and inductors.

The following specifications are processing details and conditions for the main embodiments of the present invention:

The first and second dielectric layers are low dielectric constant material or materials comprising PECVD, plasma enhanced chemical vapor deposition of TEOS, tetraethoxysilane deposition with $O_3$, halogenated SiO, FSG, fluorinated silicate glass, PECVD with silane for $SiO_2$, carbon-rich silicate glass, porous low-K polymer deposition, in a thickness range from 2,000 to 10,000 Angstroms deposited by CVD, chemical vapor deposition or spun-on.

The sacrificial layers of silicon nitride are comprised of SiN in a thickness range from 200 to 800 Angstroms deposited by PECVD, plasma enhanced chemical vapor deposition. The underlying sacrificial silicon nitride, are selectively wet etched away forming both vertical channels and horizontal channels or tunnels in the insulating layers by the following highly selective wet etching method comprised of hot phosphoric acid in a temperature range of from 160 to 200° C.

The bottom copper barrier layer is comprised of TiN, TiSiN, TaN, $TaN_x$, ($Mo_2N$ and MoN), NbN, or $WN_x$, deposited by atomic layer deposition, in a thickness ranging from 20 to 200 Angstroms. 28. The top blanket copper barrier layer, second barrier, overlying the copper, is comprised of SiN deposited by PECVD, plasma-enhanced chemical vapor deposition, in a thickness ranging from 200 to 800 Angstroms.

The copper seed layers are comprised of copper deposited by atomic layer deposition, thickness range from 20 to 200 Angstroms, with atomic layer deposition conditions of: approximate temperature range from 200 to 300° C., pressure range from 10 to 200 mTorr, deposition rate ranging from 0.01 to 0.05 nm per cycle, and pulse time varying from 0.05 to 0.5 seconds.

The electroless plated thick copper on the copper seed layers, filling channel or tunnel openings with an excess of copper, comprising the following deposition conditions: a liquid plating bath mixture comprising $CuSO_4$, HF, HCl, $CH_2O$ with heat in a temperature range from 25 to 65° C., yielding a copper plating thickness ranging from 2,000 to 10,000 Angstroms.

Figure 4A:
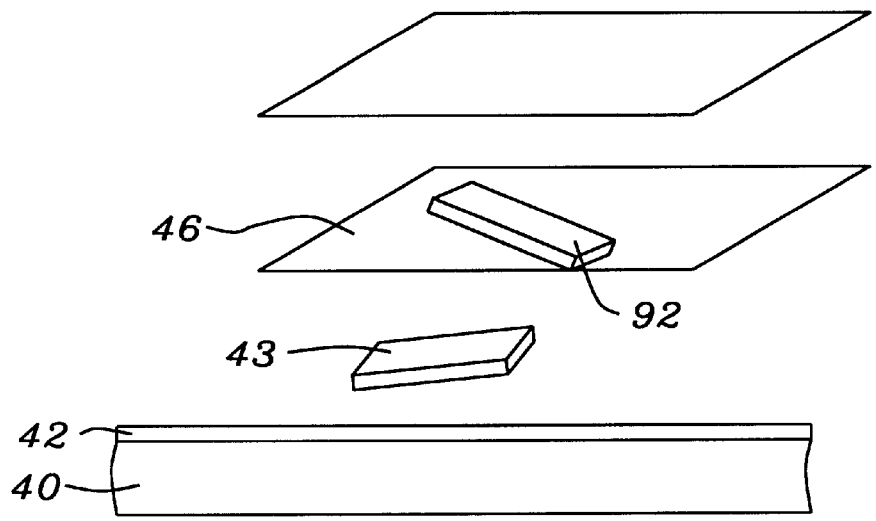
FIGS. 4A–4C, which in a cross-sectional side-view projected images, illustrate one of the embodiments of the present invention, in which vertical trenches and horizontal channels are formed simultaneously and filled by electroless deposition of copper.
Figure 4B:
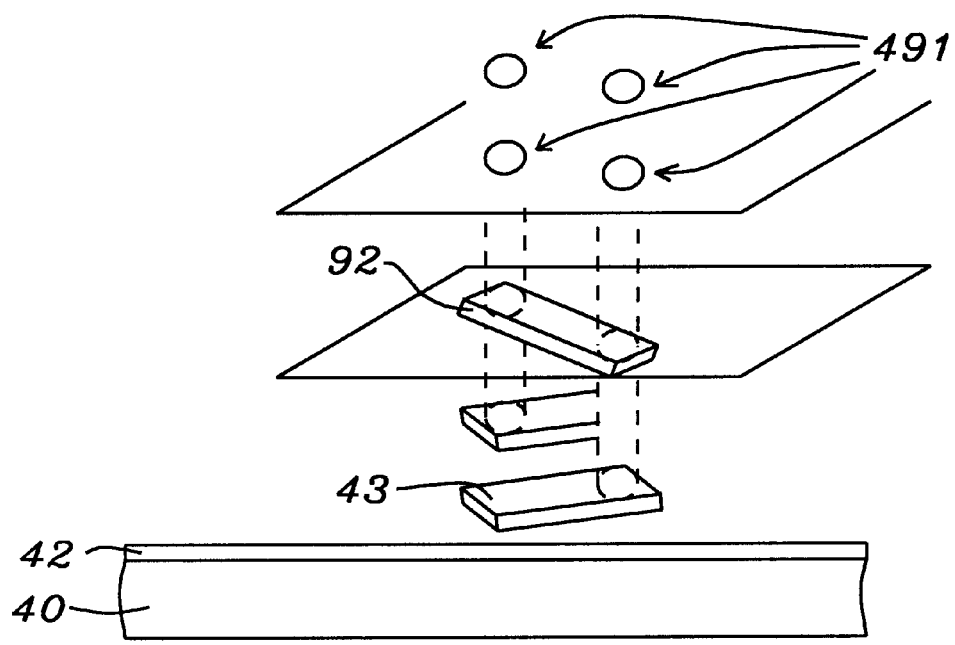
Figure 4C:
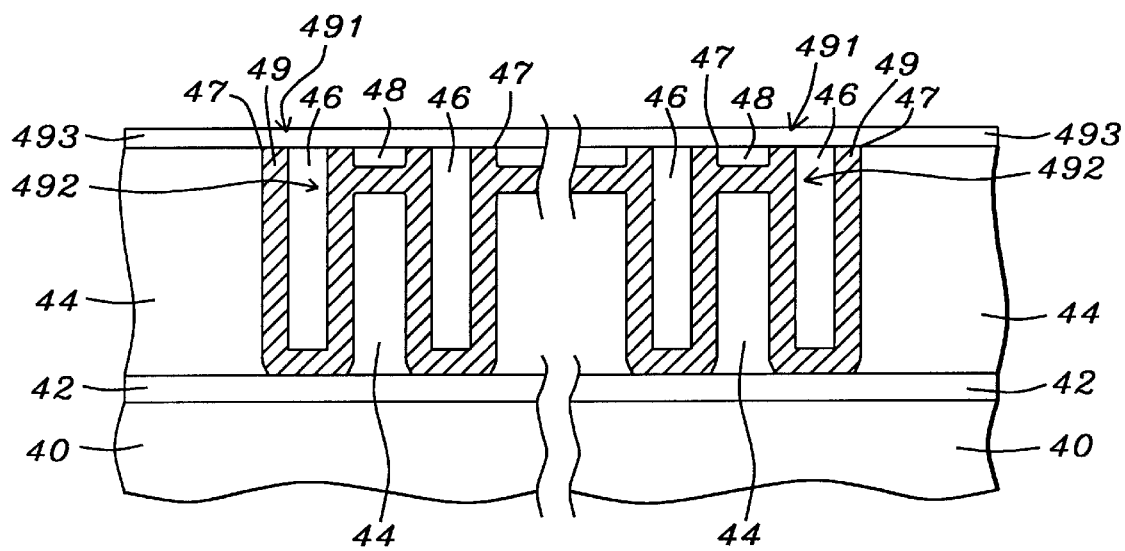

FIGS. 4A–4C, which in cross-sectional side-view projected images, illustrate one of the embodiments of the present invention, in which vertical trenches and horizontal channels are formed simultaneously and filled by electroless deposition of copper.

Referring to FIG. 4A, which is a three dimensional, projected side-view projected image, illustrating a silicon substrate or silicon oxide substrate 40, a thin insulating layer 42 formed over silicon substrate 40. Next, a layer of silicon nitride 43 is formed in trench opening, and later etched away to form the bottom horizontal channels. Next, a first thick dielectric layer is deposited and planarized over the thin insulating layer 42. Next, a second thin dielectric layer 46 is formed over thin second insulating layer, together with a SiN layer 92 formed in a trench opening, and later etched away, as a sacrificial layer, to form the top horizontal channels. This is formed similar to 42, except it angles forming the top region of the inductor.

Referring to FIG. 4B, which is a three dimensional projected side-view projected image, illustrating features similar to FIG. 4A. In FIG. 4B, with top view of vertical trench 491 openings, silicon nitride 43 and 92, sacrificial layers etched away.

Referring to FIG. 4C, which in a cross-sectional projected image, side view, illustrates the dielectric formed for channels and trenches 48, a deposition of a copper barrier layer and copper seed layer 47 over exposed dielectric surfaces by ALD. Next, a deposition of a thick copper layer 49 over copper seed layer 47 by ALD and the CMP, chemical mechanical polish back the excess copper to planarize surface. The vertical trenched formed 491 are shown by arrows and 492 horizontal channels 492 (arrows) are filled by electroless deposition of copper 49. A top layer of barrier SiN (493), optional, completes the structure.

Figure 5A:
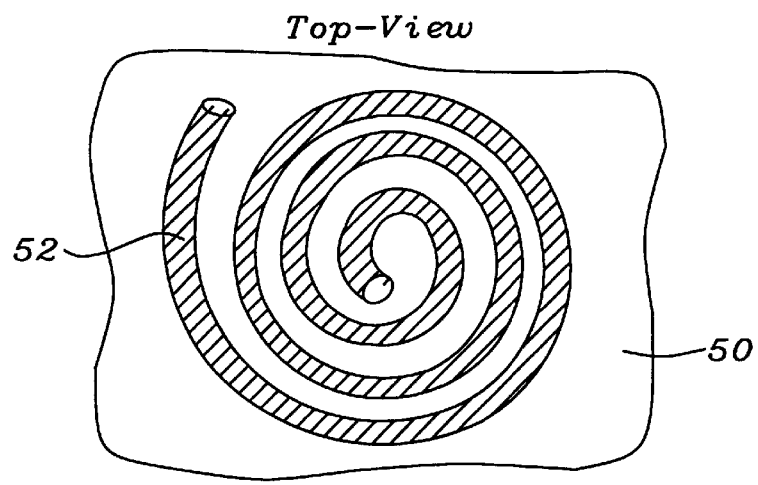
FIGS. 5A–5B, which in cross-sectional representation illustrates yet another embodiment of the present invention, a planar spiral structure, consisting of a long micro-channel, have many applications, some of which are outside of the Semiconductor Industry.
Figure 5B:
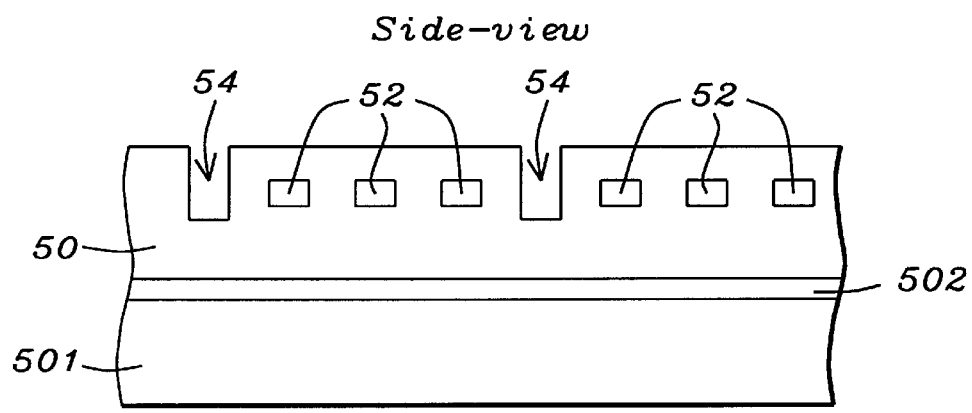

FIGS. 5A–5B, which in cross-sectional representation illustrates yet another embodiment of the present invention, a planar spiral structure, consisting of a long micro-channel 52, have many applications, some of which are outside of the Semiconductor Industry. For example, one can use this technique to form copper interconnects, inductors, and bio-sensors for applications, such as, columns for gas or liquid separation in gas chromatography and in capillary separation. Referring to FIG. 5A, this is a top view of a planar spiral structure, consisting of a long micro-channel 52 in an insulating layer 50. Referring to FIG. 5B, this is a cross-sectional representation illustrating the planar spiral structure, shown in FIG. 5A, consisting of a long micro-channel 52, in a dielectric layer 50, depicting a substrate 501, with a thin insulating layer 502 over substrate 501. A thick dielectric layer 50 is formed over thin insulating layer 502. A long micro-channel 52 is formed together with top open regions 54 (arrows).

Figure 6:
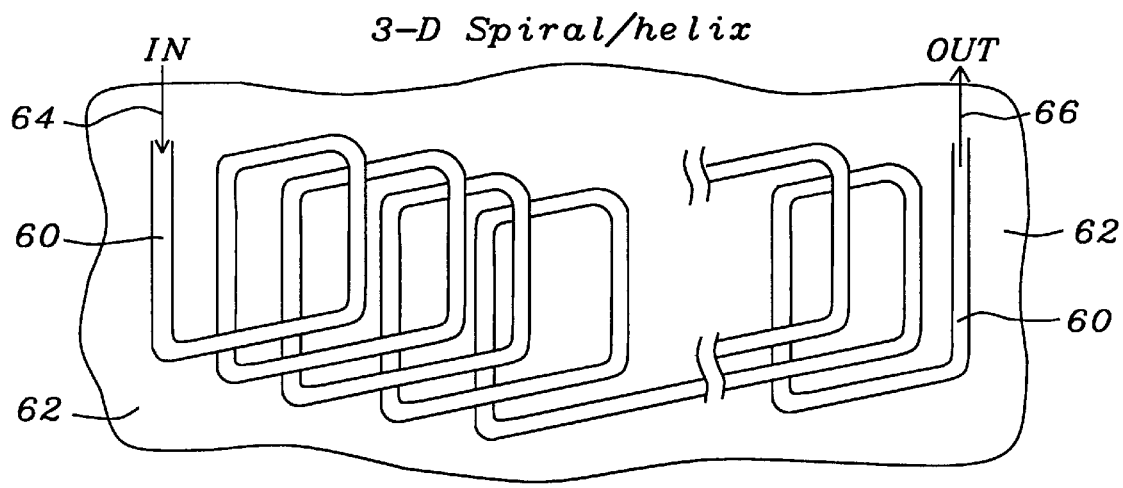
FIG. 6, which in a crude three-dimensional sketch illustrates another embodiment of the present invention, whereby a long spiral or channel helix is formed, which has many applications, some of which are outside of the Semiconductor Industry.

Referring to FIG. 6, which is a crude three-dimensional sketch, which illustrates another embodiment of the present invention, whereby a long spiral or channel helix 60 is formed, which has many applications, some of which are outside of the Semiconductor Industry. More specifically, this method has broad applications in semiconductors, for copper interconnects and inductors, as well as, in the field of bio-sensors for mini- or micro-columns in gas or liquid separation, gas/liquid chromatography, and in capillary separation techniques. The substrate material 62 is sketched as the background, base material, with the "in" opening 64 (arrow) to 3-D spiral/channel helix and the "out" opening 66 (arrow) to 3-D spiral/channel helix sketched in FIG. 6.

While the invention has been particularly shown and described with reference to the preferred embodiments thereof, it will be understood by those skilled in the art that various changes in form and details may be made without departing from the spirit and scope of the invention.

What is claimed is:

1. A method of forming trench and channel, or tunnel, openings for an inductor comprising the following steps:

(a) providing an insulating layer overlying a substrate;

(b) forming a patterned first silicon nitride sacrificial layer, for subsequent channel formation, over the insulating layer;

(c) providing a first dielectric layer, overlying said patterned first silicon nitride sacrificial layer;

(d) forming a patterned second silicon nitride sacrificial layer over the first dielectric layer;

(e) forming a second dielectric layer, over said patterned second silicon nitride sacrificial layer and planarizing the second dielectric layer, by chemical mechanical polishing;

(f) forming via openings in the second dielectric layer, by patterning and selectively removing regions of the second dielectric layer, by a reactive ion etch, stopping on the patterned second silicon nitride sacrificial layer, while exposing portions of the underlying first silicon nitride sacrificial layer;

(g) changing plasma etching chemistry to etch through exposed regions of the underlying second silicon nitride sacrificial layer, and while continuing to pattern the first dielectric layer, forming vertical channels of the inductor by reactive ion etching, stopping on the patterned first silicon nitride sacrificial layer;

(h) selectively wet etching away the underlying first and second silicon nitride sacrificial layers, thus forming both top and bottom horizontal channels or tunnels.

2. The method of claim 1, wherein said substrate includes a semiconductor substrate or silicon oxide substrate with semiconductor device structures comprising gate electrodes and source/drain regions.

3. The method of claim 1, wherein said substrate includes a semiconductor substrate with semiconductor device structures comprising gate electrodes, source/drain regions and multiple levels of metal interconnections.

4. The method of claim 1, wherein multilevel interconnected vertical channels and horizontal channels or tunnels are fabricated by repeating steps (b) through (h).

5. The method of claim 1, wherein said first and second dielectric layers are low dielectric constant material or materials comprising PECVD, plasma enhanced chemical vapor deposition of TEOS, tetraethoxysilane deposition with $O_3$, halogenated SiO, FSG, fluorinated silicate glass, PECVD with silane for $SiO_2$, carbon-rich silicate glass, porous low-K polymer deposition, in a thickness range from 2,000 to 10,000 Angstroms deposited by chemical vapor deposition or spun-on.

6. The method of claim 1, wherein said sacrificial layers of first and second silicon nitride are comprised of SiN in a thickness range from 200 to 800 Angstroms deposited by plasma enhanced chemical vapor deposition.

7. The method of claim 1, wherein said underlying first and second sacrificial silicon nitride layers, are selectively wet etched away forming both vertical channels and horizontal channels or tunnels in the dielectric layers by the following highly selective wet etching method comprised of hot phosphoric acid in a temperature range of from 160 to 200° C.

8. The method of claim 1, wherein multilevel interconnected vertical channels and horizontal channels or tunnels, fabricated by repeating steps (b) through (h), comprise a list of broad applications in semiconductors, and bio-sensors comprised of: mini- or micro-columns for gas or liquid separation, gas/liquid chromatography, and capillary separation techniques.

9. A method of forming trench and channel, or tunnel, openings and then coating the surface of trench and channel or tunnel, openings with a copper barrier layer and a copper seed layer, in the fabrication of interconnects and inductors, comprising the following steps:

(a) providing an insulating layer overlying a substrate;

(b) forming a patterned first silicon nitride sacrificial layer, for subsequent channel formation, over the insulating layer;

(c) providing a first dielectric layer overlying said patterned first silicon-nitride sacrificial layer;

(d) forming a patterned second silicon nitride sacrificial layer over the first dielectric layer;

(e) forming a second dielectric layer over said patterned second silicon nitride and planarizing the second dielectric layer by chemical mechanical polishing;

(f) forming via openings in the second dielectric layer by patterning and selectively removing regions of the second dielectric layer by a reactive ion etch, stopping on the patterned second silicon nitride sacrificial layer, while exposing portions of underlying first silicon nitride sacrificial layer;

(g) changing plasma etching chemistry to etch through exposed regions of the underlying second silicon nitride sacrificial layer, and while continuing to pattern the first dielectric layer forming vertical channels of the inductors by reactive ion etching, stopping on the patterned first silicon nitride sacrificial layer;

(h) selectively wet etching away the underlying patterned first and second silicon nitride sacrificial layers, forming both top and bottom horizontal channel or tunnel openings;

(i) depositing said copper barrier layer coating both vertical channels and horizontal channels or tunnels in the first and second dielectric layers, by atomic layer deposition;

(j) depositing said copper seed layer overlying said copper barrier layer, by atomic layer deposition, thus coating the surface of trench and channel or tunnel, openings with said copper barrier layer and said copper seed layer, in the fabrication of interconnects and inductors.

10. The method of claim 9, wherein said substrate includes a semiconductor substrate or silicon oxide substrate with semiconductor device structures comprising gate electrodes and source/drain regions.

11. The method of claim 9, wherein said substrate includes a semiconductor substrate with semiconductor device structures comprising gate electrodes, source/drain regions and multiple levels of metal interconnections.

12. The method of claim 9, wherein said first and second dielectric layers are low dielectric constant material or materials comprising PECVD, plasma enhanced chemical vapor deposition of TEOS, tetraethoxysilane deposition with $O_3$, halogenated SiO, FSG, fluorinated silicate glass, PECVD with silane for $SiO_2$, carbon-rich silicate glass, porous low-K polymer deposition, in a thickness range from 2,000 to 10,000 Angstroms deposited by chemical vapor deposition or spun-on.

13. The method of claim 9, wherein said sacrificial layers of first and second silicon nitride are comprised of SiN in a thickness range from 200 to 800 Angstroms deposited by plasma enhanced chemical vapor deposition.

14. The method of claim 9, wherein said underlying first and second sacrificial silicon nitride layers, are selectively wet etched away forming both vertical channels and horizontal channels or tunnels in the insulating layers by the following highly selective wet etching method comprised of hot phosphoric acid in a temperature range of from 160 to 200° C.

15. The method of claim 9, wherein said copper barrier layer is selected from the group consisting of TiN, TiSiN, tantalum nitride, ($Mo_2N$ and MoN), NbN, and tungsten nitride, deposited by atomic layer deposition, to a thickness ranging from 20 to 200 Angstroms.

16. The method of claim 9, wherein said copper seed layer is comprised of copper deposited by atomic layer deposition, thickness range from 20 to 200 Angstroms, with atomic layer deposition conditions of: approximate temperature range from 200 to 300° C., pressure range from 10 to 200 mTorr, deposition rate ranging from 0.01 to 0.05 nm per cycle, and pulse time varying from 0.05 to 0.5 seconds.

17. A method of forming trench and channel, or tunnel openings and then coating the surface of trench and channel or tunnel openings with a copper barrier layer and a copper seed layer, filling the tunnel openings by electroless plating of copper, in the fabrication of interconnects and inductors, comprising the following steps:

(a) providing an insulating layer overlying a substrate;

(b) forming a patterned first silicon nitride sacrificial layer, for subsequent channel formation, over the insulating layer;

(c) providing a first dielectric layer overlying said patterned first silicon nitride sacrificial layer;

(d) forming a patterned second silicon nitride sacrificial layer over the first dielectric layer;

(e) forming a second dielectric layer over said patterned second silicon nitride and planarizing the second dielectric layer by chemical mechanical polishing;

(f) forming via openings in the second dielectric layer by patterning and selectively removing regions of the second dielectric layer by a reactive ion etch, stopping on the second silicon nitride sacrificial layer, while exposing portions of the underlying first silicon nitride sacrificial layer;

(g) changing plasma etching chemistry to etch through exposed regions of the underlying second silicon nitride sacrificial layer, and while continuing to pattern the first dielectric layer forming vertical channels of the inductors by reactive ion etching, stopping on the first silicon nitride sacrificial layer;

(h) selectively wet etching away the underlying first and second silicon nitride sacrificial layers, forming both top and bottom horizontal channel or tunnel openings;

(i) depositing a bottom copper barrier layer, first barrier, coating both vertical channels and horizontal channels or tunnels in the first and second dielectric layers, by atomic layer deposition;

(j) depositing said copper seed layer overlying said bottom copper barrier layer, by atomic layer deposition, coating surface of trench and channel or tunnel openings with said bottom copper barrier layer and said copper seed layer;

(k) performing electroless copper plating copper on said copper seed layer filling trench and channel or tunnel openings with an excess of copper;

(l) removing said excess of copper and planarizing back the excess copper by chemical mechanical polishing;

(m) depositing a top blanket copper barrier layer, second barrier, thus completing the fabrication of inlaid copper interconnects and inductors.

18. The method of claim 17, wherein multilevel inlaid copper interconnects and inductors are fabricated by repeating steps (b) through (m).

19. The method of claim 17, wherein said substrate includes a semiconductor substrate or silicon oxide substrate with semiconductor device structures comprising gate electrodes and source/drain regions.

20. The method of claim 17, wherein said substrate includes a semiconductor substrate with semiconductor device structures comprising gate electrodes, source/drain regions and multiple levels of metal interconnections.

21. The method of claim 17, wherein said first and second dielectric layers are low dielectric constant material or materials comprising PECVD, plasma enhanced chemical vapor deposition of TEOS, tetraethoxysilane deposition with $O_3$, halogenated SiO, FSG, fluorinated silicate glass, PECVD with silane for $SiO_2$, carbon-rich silicate glass, porous low-K polymer deposition, in a thickness range from 2,000 to 10,000 Angstroms deposited by (CVD,) chemical vapor deposition or spun-on.

22. The method of claim 17, wherein said sacrificial layers of first and second silicon nitride are comprised of SiN in a thickness range from 200 to 800 Angstroms deposited by plasma enhanced chemical vapor deposition.

23. The method of claim 17, wherein said underlying first and second sacrificial silicon nitride layers, are selectively wet etched away forming both vertical channels and horizontal channels or tunnels in the insulating layers by the following highly selective wet etching method comprised of hot phosphoric acid in a temperature range of from 160 to 200° C.

24. The method of claim 17, wherein said bottom copper barrier layer is selected from the group consisting of TiN, TiSiN, tantalum nitride, ($Mo_2N$ and MoN), NbN, and tungsten nitride deposited by atomic layer deposition, in a thickness ranging from 20 to 200 Angstroms.

25. The method of claim 17, wherein said copper seed layer overlying the bottom copper barrier layer, is comprised of copper deposited by atomic layer deposition, thickness range from 20 to 200 Angstroms, with atomic layer deposition conditions of: approximate temperature range from 200 to 300° C., pressure range from 10 to 200 mTorr, deposition rate ranging from 0.01 to 0.05 nm per cycle, and pulse time varying from 0.05 to 0.5 seconds.

26. The method of claim 17, wherein said electroless plated copper on the copper seed layer, filling channel or tunnel openings with an excess of copper, comprising the following deposition conditions; a liquid plating bath mixture comprising $CuSO_4$, HF, HCl and $CH_2O$ with heat in a temperature range from 25 to 65° C., yielding a copper plating thickness ranging from 2,000 to 10,000 Angstroms.

27. The method of claim 17, wherein said excess copper is planarized back by chemical mechanical polishing, forming inlaid copper interconnect wiring and inductors.

28. The method of claim 17, wherein said top blanket copper barrier layer, second barrier, overlying the copper, is comprised of SiN deposited by PECVD, plasma-enhanced chemical vapor deposition, in a thickness ranging from 200 to 800 Angstroms.

* * * * *